(12) United States Patent
Liang et al.

(10) Patent No.: US 10,457,550 B2
(45) Date of Patent: Oct. 29, 2019

(54) MEMS DEVICES AND METHODS OF FORMING SAME

(71) Applicant: Taiwan Semiconductor Manufacturing Company, Ltd., Hsinchu (TW)

(72) Inventors: Kai-Chih Liang, Zhubei (TW); Chia-Hua Chu, Zhubei (TW); Te-Hao Lee, Hsinchu (TW); Jiou-Kang Lee, Zhu-Bei (TW); Chung-Hsien Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/160,683

(22) Filed: Oct. 15, 2018

(65) Prior Publication Data
US 2019/0047851 A1 Feb. 14, 2019

Related U.S. Application Data

(60) Continuation of application No. 15/354,747, filed on Nov. 17, 2016, now Pat. No. 10,099,919, which is a
(Continued)

(51) Int. Cl.
*H01L 21/76* (2006.01)
*B81C 1/00* (2006.01)
*B81B 7/00* (2006.01)

(52) U.S. Cl.
CPC ........ *B81C 1/00515* (2013.01); *B81B 7/0006* (2013.01); *B81B 7/0077* (2013.01); *B81C 1/00293* (2013.01); *B81C 1/00301* (2013.01); *B81B 2201/0235* (2013.01); *B81B 2203/0315* (2013.01); *B81B 2207/07* (2013.01); *B81B 2207/095* (2013.01); *B81B 2207/096* (2013.01); *B81C 2201/014* (2013.01); *B81C 2201/0132* (2013.01); *B81C 2203/0109* (2013.01); *B81C 2203/0118* (2013.01);
(Continued)

(58) Field of Classification Search
CPC ................ H01L 21/76898; H01L 21/76251
See application file for complete search history.

(56) References Cited

U.S. PATENT DOCUMENTS

| 6,384,473 B1 | 5/2002 | Peterson |
| 7,615,833 B2 | 11/2009 | Larson, III |

(Continued)

FOREIGN PATENT DOCUMENTS

| CN | 1683234 A | 10/2005 |
| CN | 102197479 A | 9/2011 |

*Primary Examiner* — Trang Q Tran
(74) *Attorney, Agent, or Firm* — Slater Matsil, LLP

(57) ABSTRACT

A microelectromechanical system (MEMS) device may include a MEMS structure over a first substrate. The MEMS structure comprises a movable element. Depositing a first conductive material over the first substrate and etching trenches in a second substrate. Filling the trenches with a second conductive material and depositing a third conductive material over the second conductive material and the second substrate. Bonding the first substrate and the second substrate and thinning a backside of the second substrate which exposes the second conductive material in the trenches.

20 Claims, 15 Drawing Sheets

Related U.S. Application Data division of application No. 14/624,008, filed on Feb. 17, 2015, now Pat. No. 9,499,396, which is a division of application No. 13/571,264, filed on Aug. 9, 2012, now Pat. No. 8,987,059.

(60) Provisional application No. 61/583,048, filed on Jan. 4, 2012.

(52) U.S. Cl.
CPC ............... *B81C 2203/0145* (2013.01); *B81C 2203/035* (2013.01); *H01L 2224/11* (2013.01)

(56) References Cited

U.S. PATENT DOCUMENTS

| | | |
|---|---|---|
| 8,525,278 B2 | 9/2013 | Chu et al. |
| 2005/0127499 A1 | 6/2005 | Harney et al. |
| 2005/0227401 A1 | 10/2005 | Lee |
| 2007/0290308 A1 | 12/2007 | Kim et al. |
| 2010/0252898 A1* | 10/2010 | Tanaka ............... B81B 7/0041 257/415 |
| 2011/0049652 A1 | 3/2011 | Wu et al. |
| 2011/0210452 A1 | 9/2011 | Roozeboom et al. |
| 2013/0168852 A1 | 7/2013 | Liang et al. |

* cited by examiner

MEMS DEVICES AND METHODS OF FORMING SAME

PRIORITY CLAIM AND CROSS-REFERENCE

This application is a continuation of U.S. patent application Ser. No. 15,354,747, filed Nov. 17, 2016, which is a divisional of U.S. patent application Ser. No. 14/624,008, filed Feb. 17, 2015 (now U.S. Pat. No. 9,499,396, Issued Nov. 22, 2016), which is a divisional of U.S. patent application Ser. No. 13/571,264, filed Aug. 9, 2012 (now U.S. Pat. No. 8,987,059, Issued Mar. 24, 2015), which claims the benefit of U.S. Provisional Application No. 61/583,048, filed on Jan. 4, 2012, which applications are hereby incorporated herein by reference.

BACKGROUND

Microelectromechanical systems ("MEMS") are becoming increasingly popular, particularly as such devices are miniaturized and are integrated into integrated circuit manufacturing processes. MEMS devices introduce their own unique requirements into the integration process, however. Electrically interconnecting MEMS devices is an area of unique challenges.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 10a through 10h illustrate further steps in processing of the yet another embodiment, including steps of bonding a MEMS device wafer and a cap wafer.

DETAILED DESCRIPTION

Figure 1A:
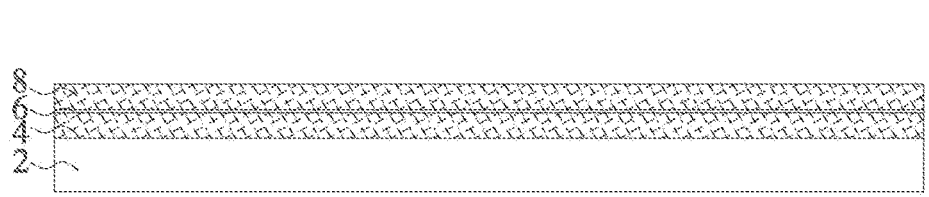
FIGS. 1a through 1i illustrate in cross section steps in the processing of an illustrative MEMS device wafer in a first embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Before addressing illustrative embodiments of the present disclosure in detail, various embodiments and advantageous features thereof will be discussed generally. For instance, several of the contemplated embodiments provide advantageous features that include the ability to obtain reduced chip size combined with a TSV-like (TSV is an acronym for through substrate via, sometimes also referred to as through silicon via) vertical scheme, which may improve overall gross die counts, thus providing cost effective solution in manufacturing. The outgassing of dielectric layers may affect the vacuum level after wafer level packaging. Some embodiments provide for a high temperature densification capability to realize higher vacuum wafer level packaging.

Other advantageous features of embodiments include, but are not limited to: (1) direct integration of second level packaging in wafer level processing; (2) reducing parasitic capacitance/inductance of input/output (I/O) interfaces; and (3) the ability to provide for wafer level hermetic sealing in high vacuum level applications, a result of high temperature densification capability.

As will be described in more detail below, embodiments of the present disclosure provide for a vertical interconnection scheme. Such a scheme includes TSV-like drillings and metal contacts for picking-up signals (i.e. for making a signal interconnection).

In some embodiments wafer level bonding is performed between two wafers. One wafer is, for example, a MEMS device wafer (i.e. a wafer upon which has been fabricated one or more MEMS devices) and the other wafer is a capping wafer. The wafers are not only bonded (e.g., glued together), but also a good hermetic vacuum environment in micro chambers between the two wafers is formed. Vacuum levels from about 0.1 to 100 mbar are reachable in the contemplated embodiments, as a result of the described high thermal budgets.

In one embodiment, TSV-like drillings can be processed on a capping wafer after the two wafers are bonded together. In another embodiment, TSV-like drillings are formed on a capping wafer before the two wafers are bonded together. Regardless of the embodiment, an advantageous feature is the ability to realize the goal of chip shrinkage, i.e., greater circuit density. In some embodiments, the drilling process will stop on a conductive layer. After that, sidewall isolation is formed and conductive films are deposited, e.g., by Cu plating, metal sputtering, or a doped polysilicon process. This process can occur either before or after the wafer bonding steps. As a result, the two wafers will be bonded together by metallic bonding. When the bonding process finished, wafer thinning may be performed on the capping wafer backside to expose conductive films on the capping wafer. This thinning may be accomplished by, e.g., by polishing, etching, or grinding methods. When the conductive film is exposed on the capping wafer backside, further interconnect processes, e.g., bumping processes for 3rd level packaging interconnection, can be performed.

An interposer can also be employed to form the vertical interconnection in a MEMS integration application, albeit at the cost of increased stacked die stress and more process complexity.

Before turning to the illustrated embodiments, some general observations about various embodiments are provided. For instance, in some embodiments, all dielectric layers on the MEMS device wafer and/or the capping wafer can be deposited or densified at high temperature, which can help reduce the release from of gases from the dielectric films such as nitrogen, oxygen, or hydrogen. A densified dielectric layer is a dielectric layer that may have been exposed to, for example, higher temperature and/or pressure to remove moisture from the dielectric layer, and, thus make the dielectric layer denser. Advantageously, all materials inside the packaged chamber have low outgassing, either by their intrinsic property or as a result of a densification process, which may result in maintaining a greater vacuum level in the packaged chamber.

Eutectic bonding may be adopted for forming a hermetic seal and electrical connection between the MEMS device wafer and the capping wafer. Either a TSV first or a TSV last scheme can be employed and can enable electrical signal readout with small chip size. The contemplated embodiments are flexible enough to allow for an MEMS scheme with polysilicon plugs. Some embodiments allow for using polysilicon as a mechanical bump, a vapor hydrofluoric (HF) stop layer, and gap control between the MEMS wafer and the capping wafer electrodes.

In some embodiments, the MEMS scheme includes forming an oxide cavity first. An oxide cavity may allow for elimination of the polysilicon plug in order to reduce process costs. In some embodiments, the gap between the MEMS device wafer and the capping wafer electrodes may be controlled by means of a Si cavity.

With reference now to FIGS. 1a through 1i, steps in the processing of an illustrative MEMS device wafer 1 are shown. FIG. 1a shows an illustrative device including a substrate 2, on which is formed a first film 4, an etch stop layer 6, and a second film 8. Substrate 2 may be silicon, GaAs, glass, or the like. First film 4 and second film 8 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. In an illustrative embodiment, first film 4 and second film 8 are both oxides, and etch stop layer 6 is SiN. Etch stop layer 6 could alternatively be AlN, low stress SiN, or any other layer of material with high etch selectivity to layer 4 and/or 8. Etch stop layer 6 acts as an etch stop layer for vapor HF. First film 4, second film 8, and etch stop layer 6 may be deposited at high temperature (>500 C) through a process such as low pressure chemical vapor deposition (LPCVD), wet oxidation, dry oxidation, or the like. Alternatively, first film 4, second film 8, and etch stop layer 6 may be densified at higher temperature after deposition. The thickness of first film 4 and second film 8 may be designed to control parasitic feedthrough capacitance and/or the gap between the subsequent movable element of the MEMS structure and the etch stop layer 6 (see FIG. 1i). In an embodiment, the thickness of first film 4 and second film 8 may be between about 1 µm and about 5 µm. Polysilicon routing (not shown) can be optionally made and embedded inside first film 4, second film 8, and etch stop layer 6, as will be apparent to those skilled in the art.

Figure 1B:
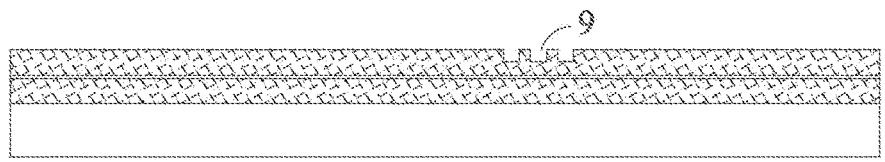
Figure 1C:
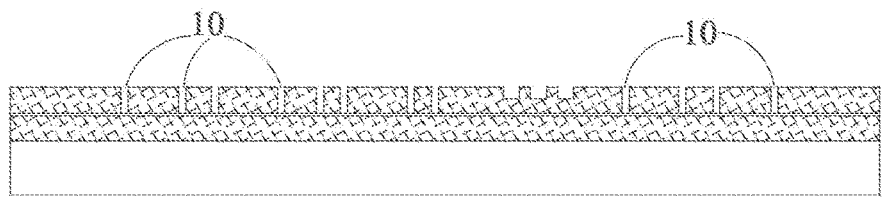

FIG. 1b illustrates shallow trench etching 9. Shallow trench etching 9 is used to form the polysilicon bump and vapor HF release channel. Trench etching 10, as shown in FIG. 1c, is then performed. Trench etching 10 is performed to form the polysilicon wall to protect second film 8 from vapor HF attacking, as will become apparent from the following description. In an illustrative embodiment, shallow trenches 9 and trenches 10 may be formed by photolithographic masking and etching or other acceptable methods.

Figure 1D:
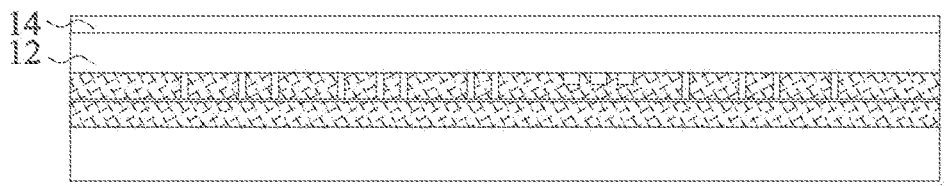

A second wafer 12, such as a silicon wafer is fusion bonded to second film 8, as shown in FIG. 1d. In an embodiment, the interface between the wafer 12 and the second film 8 may be silicon-to-silicon, silicon-to-oxide, oxide-to-oxide, or any other covalent bonding mechanism. An anneal process can be performed after the fusion bonding process to increase bonding strength between second wafer 12 and second film 8. Second wafer 12 may be thinned down to a desired thickness THK. The thinning process may include grinding and chemical mechanical polishing (CMP) processes, etch back processes, or other acceptable processes. In illustrative embodiments, second wafer 12 is thinned down to a thickness THK of from about 5 um to about 100 um After the thinning process, a gap control oxide 14 may be deposited thereon by a process such as LPCVD, plasma enhanced CVD (PECVD), wet oxidation, dry oxidation, or the like. Gap control oxide 14 may determine the gap between the subsequent movable element of the MEMS structure and electrode 40 (see FIG. 3a). As with the previously discussed layers, gap control oxide 14 can be deposited at high temperature or subsequently densified at high temperature (>500 C). In illustrative embodiments, gap control oxide 14 may be formed at a thickness from about 1 um to about 5 um.

Figure 1E:
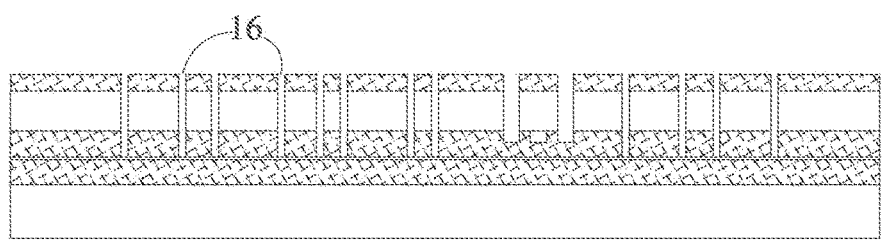

As illustrated in FIG. 1e, gap control oxide 14 and second wafer 12 are next etched to form trenches 16. These trenches 16 may be aligned with one or more of deep trenches 10 and/or shallow trenches 9 and may be formed by photolithographic masking and etching or other acceptable methods. Note that in the illustrated embodiment, at least one shallow trench 9 remains unexposed after gap control oxide 14 and second wafer 12 are etched.

Figure 1F:
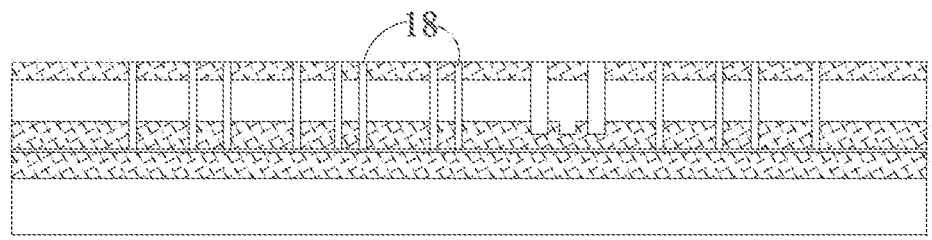

Trenches 16, which may include one or more of deep trenches 10 and/or shallow trenches 9 are next filled with a material, such as a polysilicon material 18, as illustrated in FIG. 1f. In some embodiments, polysilicon material 18 may be doped in situ during the fill process. In some embodiments, trenches 16 may be over-filled with polysilicon material, followed by a CMP step to planarize polysilicon material with the top of gap control oxide 14. In other embodiments, polysilicon material 18 may be etched back, relying upon gap control oxide 14 as an etch stop layer to achieve planarity.

Polysilicon material 18 can act as mechanical bump, vapor HF stop layer, and/or a gap control device between electrode on a MEMS device wafer and a cap wafer (not shown in FIG. 1, see FIG. 2, for example). Other material such as SiGe or the like, particularly a conformally deposited material, can be employed in lieu of polysilicon material 18.

Figure 1G:
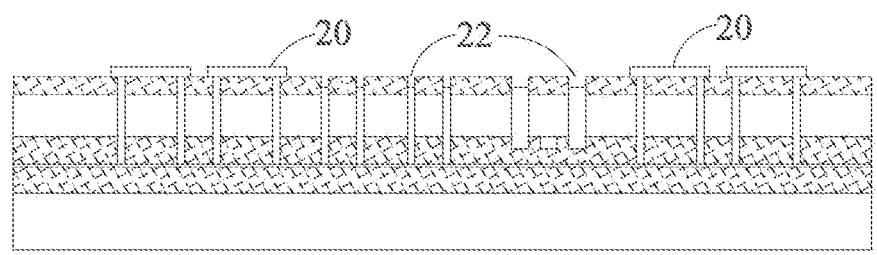

In a next illustrative step, Ge is deposited and patterned to form patterned layer 20, as illustrated in FIG. 1g. In the illustrated embodiment, an over etch process is employed to form polysilicon plug recesses 22 in those areas where polysilicon material 18 is not covered by patterned layer 20. In an embodiment, patterned layer 20 may act as a eutectic bonding material for subsequent bonding processes. Alternatively, patterned layer 20 could be a conductive material, which is also suitable for eutectic bonding, such as Al, AlCu, Au, AlCu/Ge, TiN/AlCu, TiN/Ge, a combination thereof, or any ohmic contact film to polysilicon material 18. Polysilicon plug recesses 22 help form polysilicon bumps for MEMS devices, as will be described in more detail in the following paragraphs.

Figure 1H:
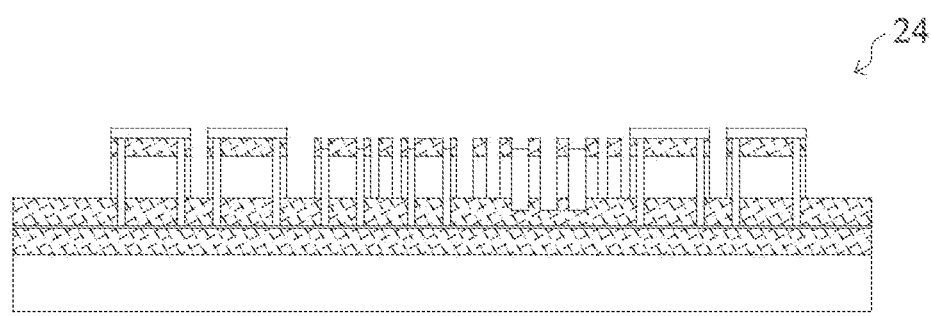

FIG. 1h illustrates the result of an etch process in which gap control oxide 14 and second wafer 12 are patterned to form MEMS structures 24, including electrodes 26. The etch process results in the formation of movable and static elements in the MEMS structures 24. The movable elements are not yet movable in FIG. 1h, as they are still on top of second film 8.

Figure 1I:
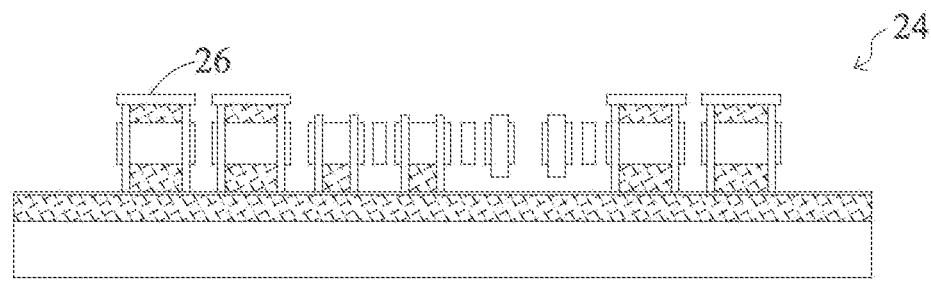

FIG. 1i illustrates the release of the MEMS structures 24 by a vapor HF etching of second film 8 and gap control oxide 14. This type of etch process has a high selectivity between gap control oxide 14, second film 8, polysilicon material 18, second wafer 12, and etch stop layer 6 so that that polysilicon material 18, second wafer 12, and etch stop layer 6 are not significantly attacked during the removal of gap control oxide 14 and second film 8. Note further that the polysilicon material 18 protects portions of second film 8 and gap control oxide 14 under electrodes 26 during the etch process. This etch process allows for free movement of the movable element in at least one axis.

Turning now to FIGS. 2a through 2d, the processing of an exemplary cap wafer 31 is illustrated. Beginning with FIG. 2a, a substrate 30 is etched by acceptable lithography techniques to form deep trenches 32. The profile of the deep trenches 32 (i.e. the sidewalls) can be either vertical or tapered.

Figure 2A:
FIGS. 2a through 2d illustrate in cross section the steps in the processing of an illustrative cap wafer in a first embodiment.
Figure 2B:
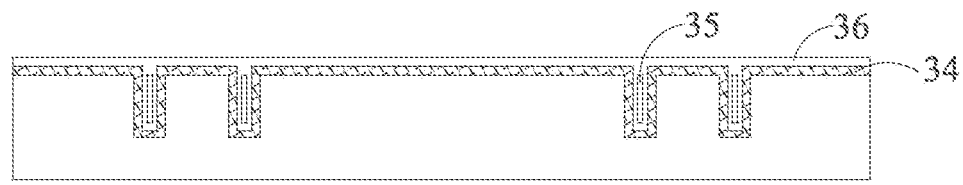

An oxide liner 34 is deposited over substrate 30 and in deep trenches 32, followed by a conductive material 36. FIG. 2b illustrates gaps 35 remaining in deep trenches 32. This is an artifact of the filling process. In some embodiments, deep trenches 32 are completely filled with oxide liner 34 and conductive material 36 without the formation of gaps or seams therein.

Oxide liner 34 may comprise thermal oxide, low pressure tetra ethyl ortho silicate (LPTEOS), PECVD oxide, or the like. Oxide liner 34 may be deposited at low temperature, such as 400 C or lower, in which case oxide liner 34 should be densified at high temperature to reduce outgassing.

Conductive material 36 may seal the tops of respective deep trenches 32. In an embodiment the conductive material 36 may comprise polysilicon, Cu, TiCu, the like, or a combination thereof. In another embodiment, deep trenches can be filled with other conductive materials, such as SiGe, or by electroplating Ni, Au, or the like.

Figure 2C:
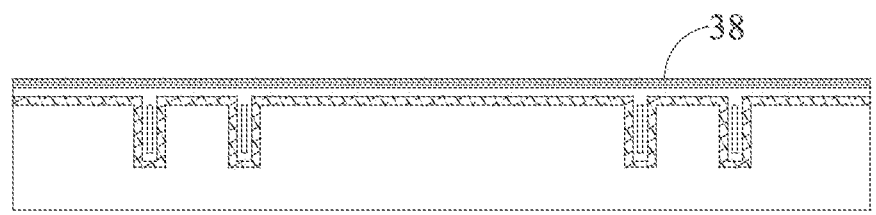
Figure 2D:
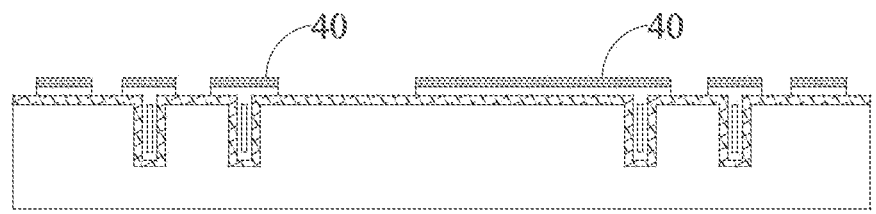

FIG. 2c illustrates the deposition of a conductive layer 38, such as AlCu across the top surface of conductive material 36. Conductive layer 38 may act as a eutectic bonding material in subsequent bonding operations. Other materials suitable for eutectic bonding, such as Ge, Au, or the like, could be employed in lieu of AlCu. Additionally, conductive layer 38 and patterned layer 20 may be interchanged (see FIG. 3f). FIG. 2d illustrates the device after conductive layer 38 and conductive material 36 have been patterned to form electrodes 40.

Figure 3A:
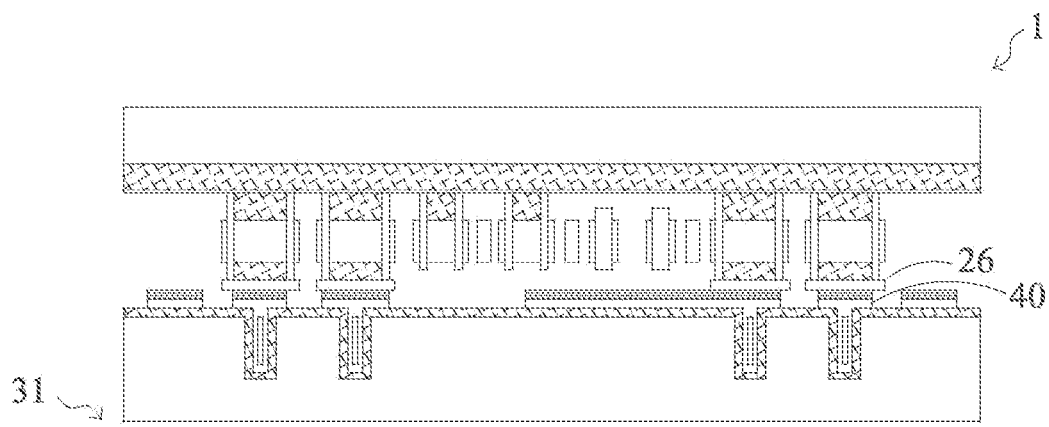
FIGS. 3a through 3f illustrate in cross section the steps in joining a MEMS device wafer with a cap wafer in a first embodiment.
Figure 3B:
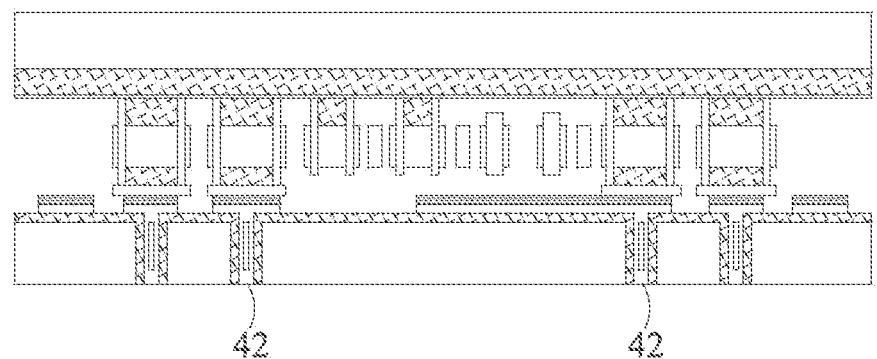
Figure 3C:
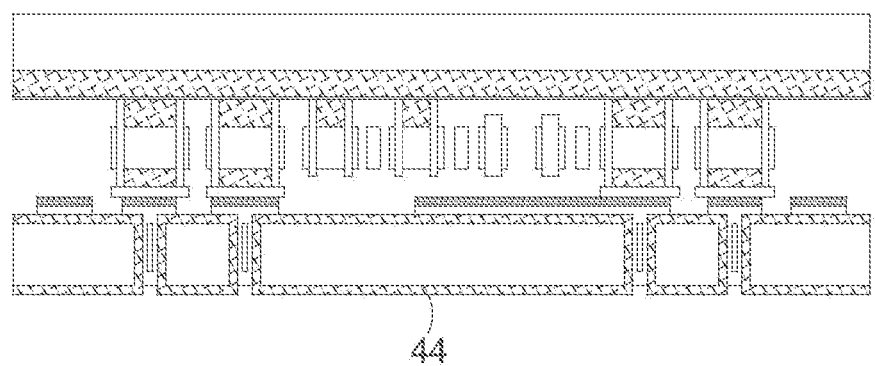
Figure 3D:
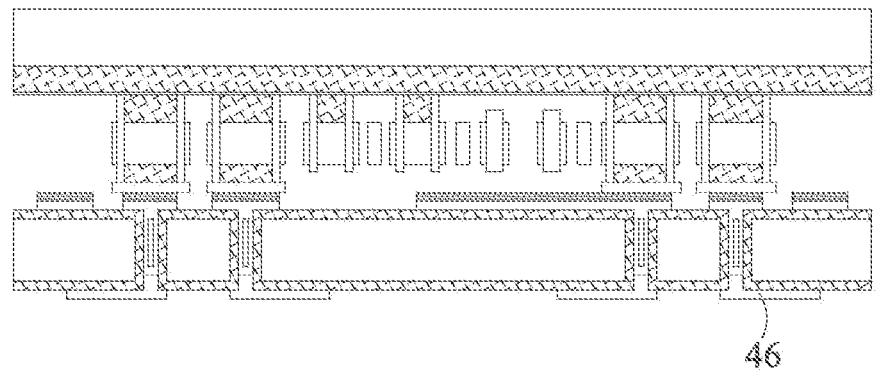
Figure 3E:
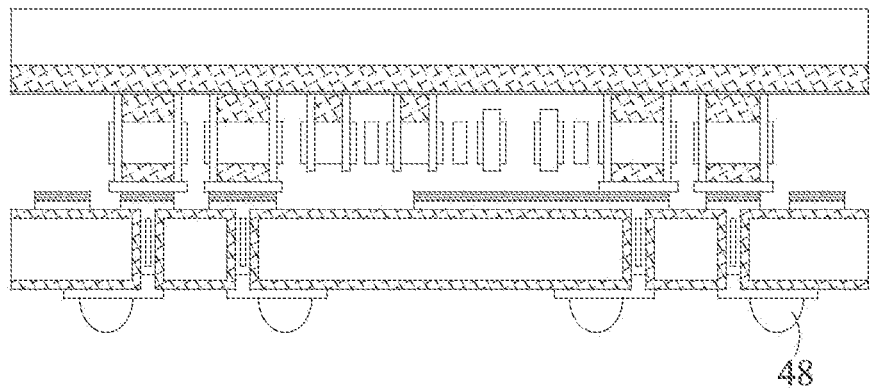
Figure 3F:
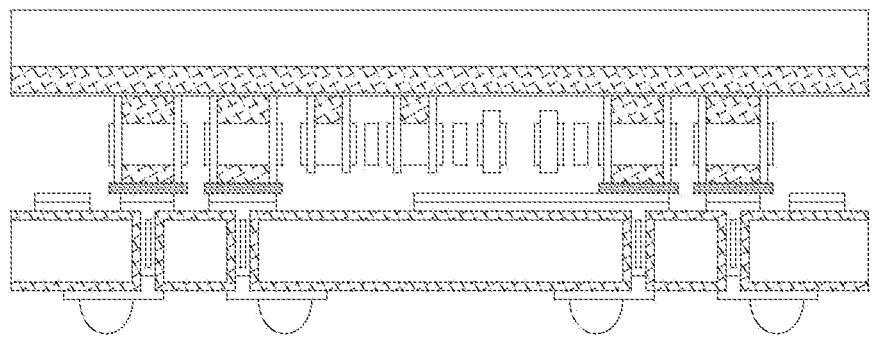
Figure 4:
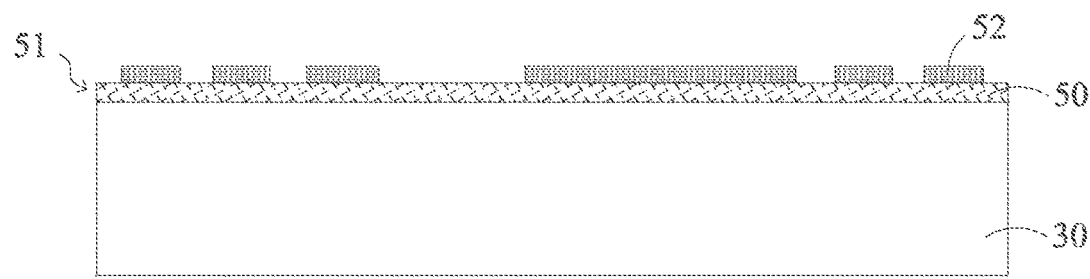
FIG. 4 illustrates processing of a cap wafer in a second embodiment.

FIGS. 3a through 3f provide an illustrative process for joining MEMS device wafer 1 with cap wafer 31. As illustrated in FIG. 3A, MEMS device wafer 1 and cap wafer 31 are bonded together by way of eutectic bonding between electrodes 26 (on MEMS device wafer 1) and electrodes 40 (on cap wafer 31). This allows for interconnection of the respective MEMS devices with external components, e.g. through connection on cap wafer 31. The pressure level of the packaged chamber can be controlled by the eutectic bonding process, e.g. performed in a vacuum chamber. In illustrative embodiments, the packaged chamber may maintain a vacuum level from about 0.1 to 100 mbar by ensuring all materials inside the packaged chamber have low outgassing by their intrinsic property or by the above-described densification processes.

Next, as shown in FIG. 3b, the backside of cap wafer 31 is thinned down to expose conductive material 36 filling deep trenches 32. The thinning process may include grinding and CMP processes, etch back processes, or other acceptable processes. Conductive material 36 effectively forms through wafer vias 42 at this point. Next, isolation oxide 44 is deposited and patterned on the backside of cap wafer 31 to provide for electrical isolation of cap wafer 31 and exposed vias 42, as illustrated in FIG. 3c.

As shown in FIG. 3d, a re-distribution layer (RDL) 46 is deposited or formed by electroplating on the backside of cap wafer 31. RDL 46 may comprise copper, tin, nickel, silver, or the like and may be patterned after formation. Connection bumps 48 are formed in electrical and physical contact with RDL 46, as shown in in FIG. 3e. Connection bumps 48 could be, e.g., solder balls or bumps, Cu bumps or studs, or the like and may comprise a material such as tin, or other suitable materials, such as silver, lead-free tin, copper, combinations thereof, or the like. In an embodiment in which connection bumps 48 are tin bumps, connection bumps 48 may be formed by initially forming a layer of tin through such acceptable methods such as evaporation, electroplating, printing, solder transfer, ball placement, or the like, and then performing a reflow in order to shape the material into the desired bump shape. Any suitable method of producing connection bumps 48 may alternatively be utilized.

In the above described embodiments, eutectic bonding occurs between a Ge electrode formed on MEMS device wafer 1 and an AlCu electrode formed on cap wafer 31. In an alternative embodiment, illustrated in FIG. 3f, eutectic bonding occurs between an AlCu electrode formed on MEMS device wafer 1 and a Ge electrode formed cap wafer 31.

FIGS. 4 and 5a through 5h illustrate the formation of another. In this embodiment MEMS device wafer 1 is formed and processed as described above with regard to FIGS. 1a through 1i. Cap wafer 51 is processed differently, beginning with the steps shown in FIG. 4. In this embodiment, substrate 30 has formed thereon isolation oxide 50. Isolation oxide 50 may comprise thermal oxide, LPTEOS oxide, PECVD oxide, or the like. Isolation oxide 50 may be deposited at low temperature, such as 400 C or lower, in which case isolation oxide 50 should be densified at high temperature to reduce outgassing. A conductive layer is next deposited and patterned to form electrodes 40. In an embodiment, the conductive layer may comprise AlCu. The conductive layer may act as a eutectic bonding material and can be replaced by conductive materials, which also suitable for eutectic bonding, such as Ge, Au, or the like.

Figure 5A:
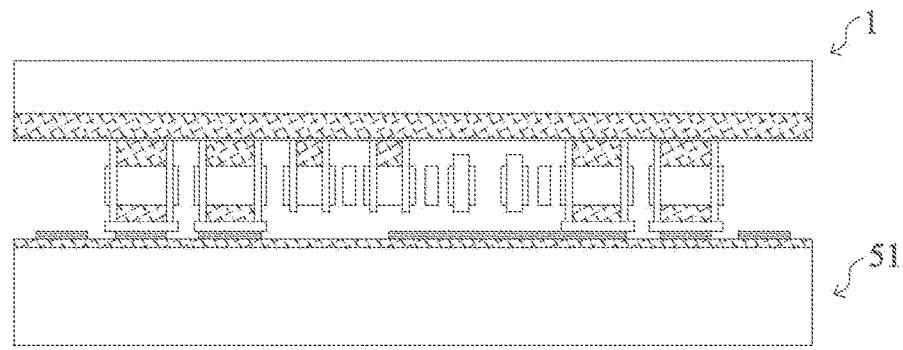
FIGS. 5a through 5h illustrate steps in bonding a MEMS device wafer and a cap wafer in a second embodiment.

FIGS. 5a through 5h illustrates steps in bonding MEMS device wafer 1 and cap wafer 51. As shown in FIG. 5a, MEMS device wafer 1 and cap wafer 51 are bonded together using eutectic bonding, similar to the process described above with reference to FIG. 3a.

Figure 5B:
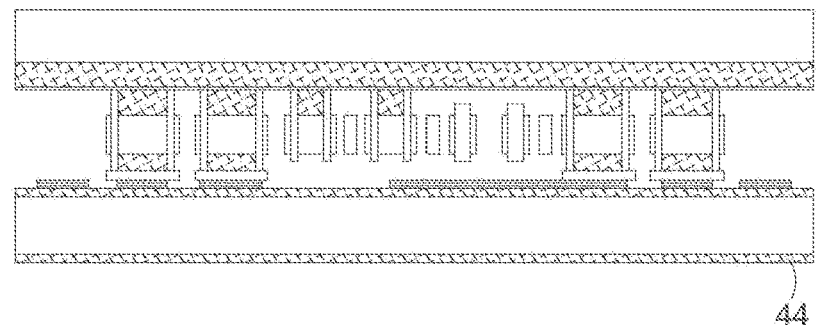
Figure 5C:
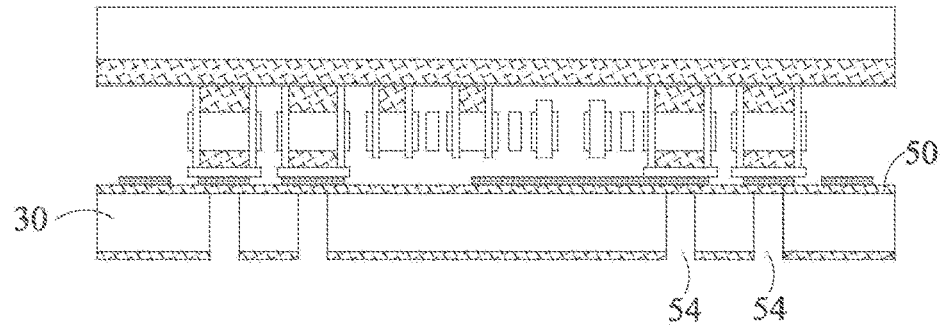
Figure 5D:
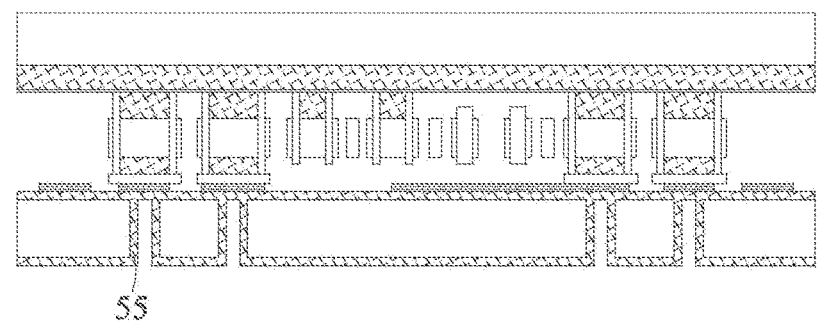
Figure 5E:
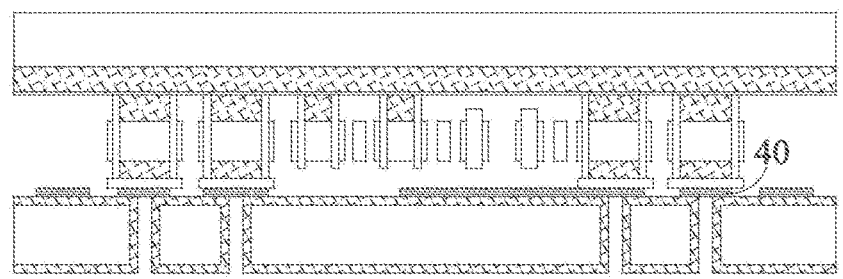

As shown in FIG. 5b, cap wafer 51 is thinned down and isolation oxide 44 is formed on the backside thereof. Isolation oxide 44 and substrate 30 are then etched to form deep vias 54, as shown in FIG. 5c. In the formation of the deep vias 54, isolation oxide 50 may be used as an etch stop layer. Oxide 55 is deposited on the sidewalls of deep vias 54, as shown in FIG. 5d. The portions of isolation oxide 50 exposed by deep vias 54 may then be etched to expose electrodes 40 from the backside, as shown in FIG. 5e.

Figure 5F:
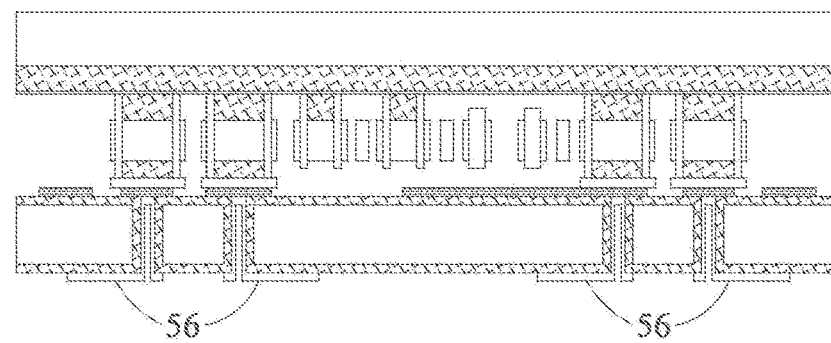
Figure 5G:
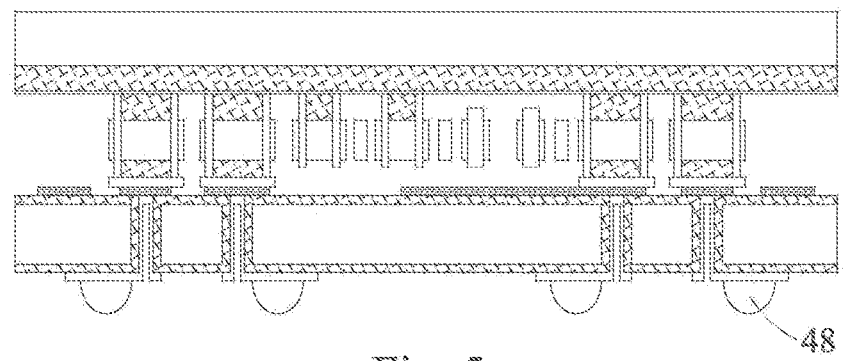
Figure 5H:
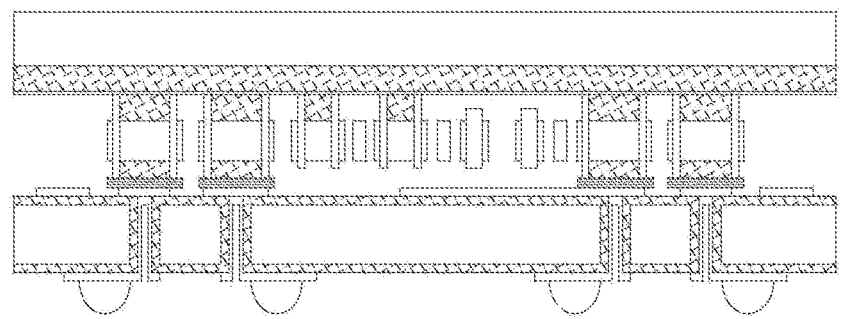

FIG. 5f illustrates the formation of RDL 56, which can be performed using, e.g., CVD deposition techniques, PVD sputtering techniques, electroplating techniques, or the like. Note that RDL 56 extends along sidewalls of deep vias 54 and in electrical and physical contact with electrodes 40. In an embodiment, RDL 56 may comprise polysilicon, Cu, TiCu, the like, or a combination thereof. In another embodiment, RDL 56 may comprise other conductive materials, such as SiGe, Ni, Au, or the like. Next, as shown in FIG. 5g, connection bumps 48 are formed. The formation of connection bumps 48 were previously described and is not repeated herein. As shown in FIG. 5h, electrodes 40 could be formed of Ge and eutectically bonded to electrodes 52 formed of AlCu on MEMS device wafer 1.

The formation of yet another embodiment is described with regard to FIGS. 6a through 6d, 7a through 7e, and 8a through 8f. Processing of MEMS device wafer 61 is described first with regard to FIGS. 6a through 6d. Oxide 64 may be deposited and patterned on substrate 62 to form oxide cavities 65. Substrate 62 may be silicon or alternatively may be GaAs, glass, or the like. Oxide 64 may be deposited at high temperature or densified at high temperature (>500 C). Oxide cavities 65 define the moving regions for subsequently formed MEMS devices. Polysilicon routing may be optionally made and embedded inside oxide 64, as is known in the art.

Figure 6A:
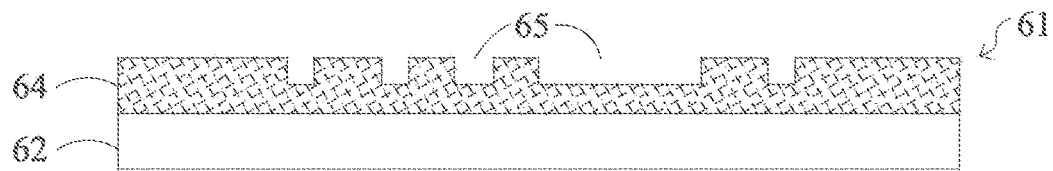
FIGS. 6a through 6d illustrate processing of a MEMS device wafer in another embodiment.
Figure 6B:
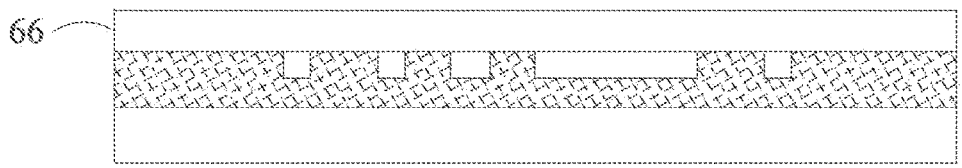
Figure 6C:
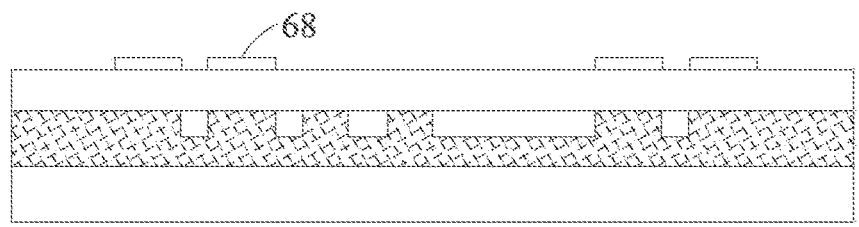

Wafer 66 may be fusion bonded to oxide 64, and thinned down to a desired thickness THK, as shown in FIG. 6b. The fusion bonding process was previously described and is not repeated herein. This thickness may range from about 5 um to about 100 um, for example. An anneal process can be applied after fusion bond to increase bonding strength between oxide 64 and wafer 66.

Figure 6D:
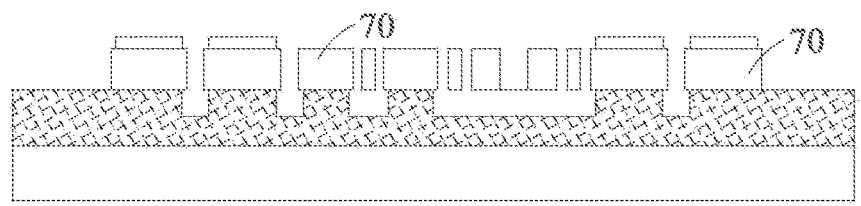

A conductive layer may be next deposited on the back side of wafer 66 and patterned to form electrodes 68. In an embodiment, the conductive layer may be Ge. The conductive layer may act as eutectic bonding material in a subsequent bonding process. Other materials suitable for eutectic bonding, such as Al, AlCu, Au, a combination thereof, or the like could alternatively be used to form electrodes 68. Next, wafer 66 is etched to form MEMS structures 70, as shown in FIG. 6d. The etch process results in the formation of movable and static elements in the MEMS structures 70. The movable element has free movement in at least one axis.

Figure 7A:
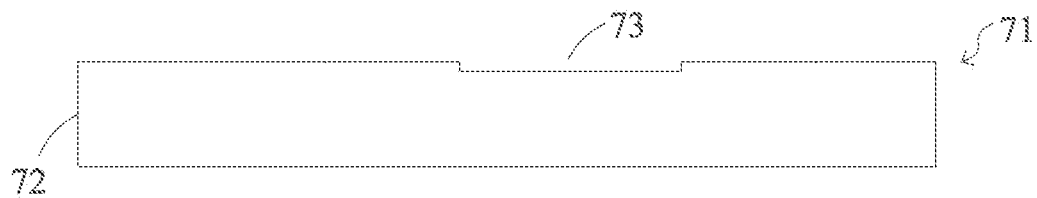
FIGS. 7a through 7e illustrate the processing of a cap wafer in another embodiment.

The processing of cap wafer 71 is now described with reference to FIGS. 7a through 7e. FIG. 7a illustrates substrate 72, in which has been etched shallow cavity 73. Shallow cavity 73 may provide for gap control between the movable element of the MEMS structure (see FIG. 6a) and electrodes 82 formed on cap wafer 71 (see FIG. 7e). In illustrative embodiments, the distance from the movable element of the MEMS structure and electrodes 82 may be from about 1 um to about 5 um.

Figure 7B:
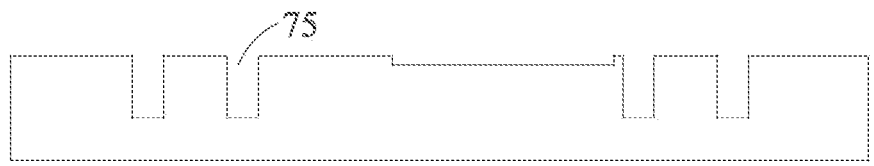
Figure 7C:
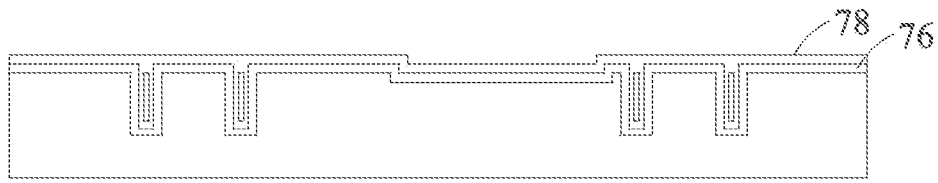

FIG. 7b illustrates the formation of deep trenches 75 in substrate 72. Deep trenches 75 may have a profile (i.e. the sidewalls) that can be either vertical or tapered. Deep trenches 75 may be filled with oxide liner 76 and polysilicon material 78, as shown in FIG. 7c. As previously described, deep trenches may be completely filled, or may be filled with a gap or seam remaining therein, as shown in FIG. 7c. Oxide liner 76 may comprise thermal oxide, LPTEOS oxide, PECVD oxide, or the like. If oxide liner 76 is deposited at low temperature, such as 400 C or lower, then oxide liner 76 should be densified at high temperature to reduce outgassing. Polysilicon material 78 may seal the opening of deep trenches 75. Other conductive materials, such as SiGe, electroplated Cu, Ni, Au, and the like could be used in lieu of polysilicon material 78.

Figure 7D:
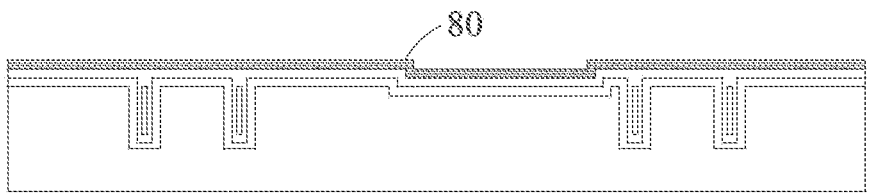
Figure 7E:
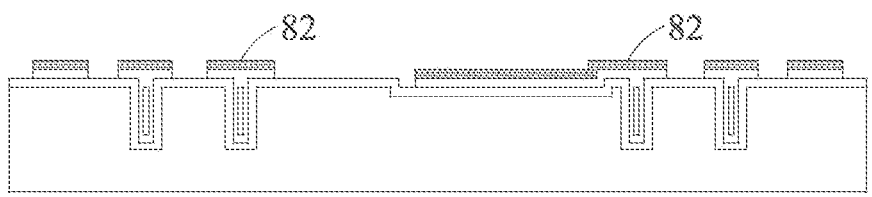

A conductive layer 80, such as AlCu is deposited or otherwise formed atop polysilicon material 78 as shown in FIG. 7d, and patterned to form electrodes 82, as shown in FIG. 7e. The conductive layer 80 acts as eutectic bonding material and can be replaced by other conductive materials, which also suitable for eutectic bonding, such as Ge, Au, or the like.

Figure 8A:
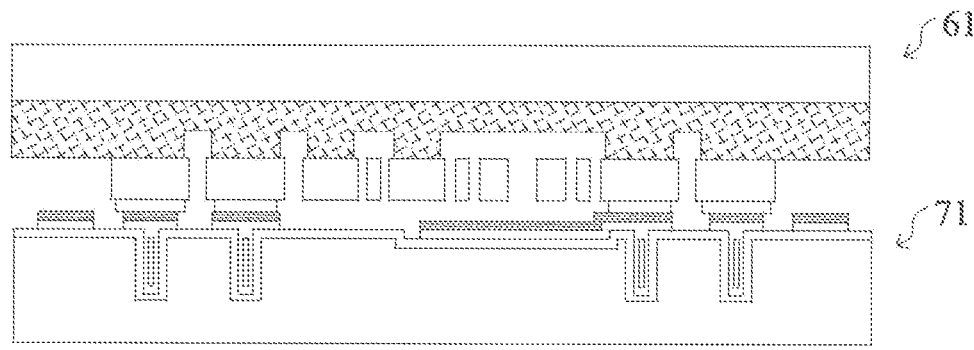
FIGS. 8a through 8f illustrate further steps in the processing of another embodiment, including steps of bonding the MEMS device wafer and the cap wafer of another embodiment.

Turning now to FIG. 8a, MEMS device wafer 61 and cap wafer 71 are bonded together using a eutectic bonding process such as described above. The pressure level of the packaged chamber can be controlled by the eutectic bonding process. In illustrative embodiments, the chamber may maintain a vacuum by ensuring all materials inside the packaged chamber have low outgassing by their intrinsic property or by the above-described densification processes.

Figure 8B:
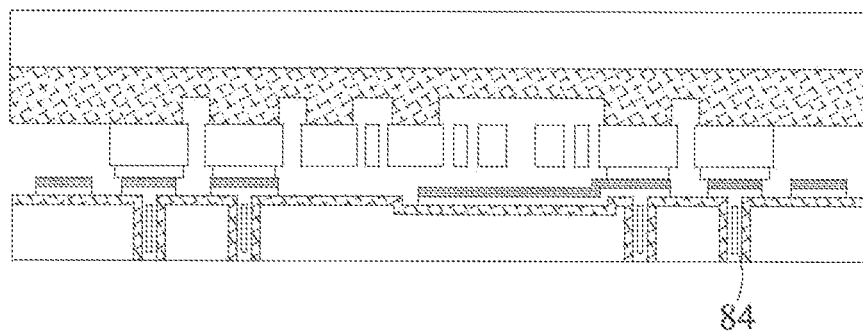
Figure 8C:
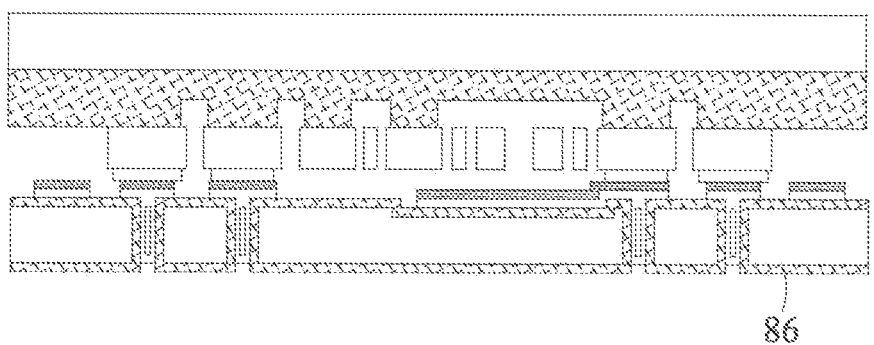

Cap wafer 71 is thinned back to expose vias or trenches 84 (formed by polysilicon material 78 in deep trenches 75), as shown in FIG. 8b. Isolation oxide 86 may then be formed on the back side of cap wafer 71, as shown in FIG. 8c.

Figure 8D:
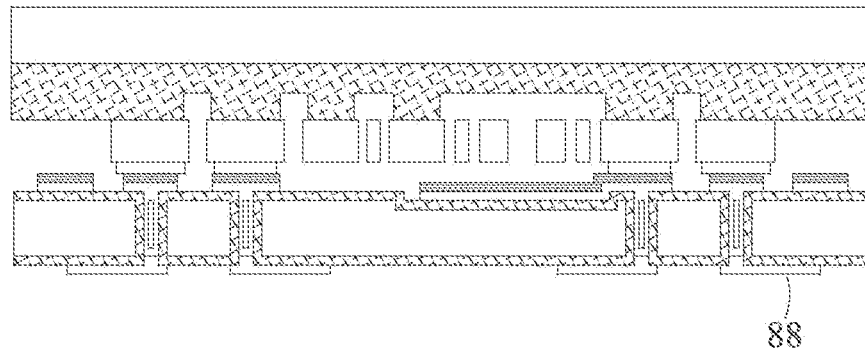
Figure 8E:
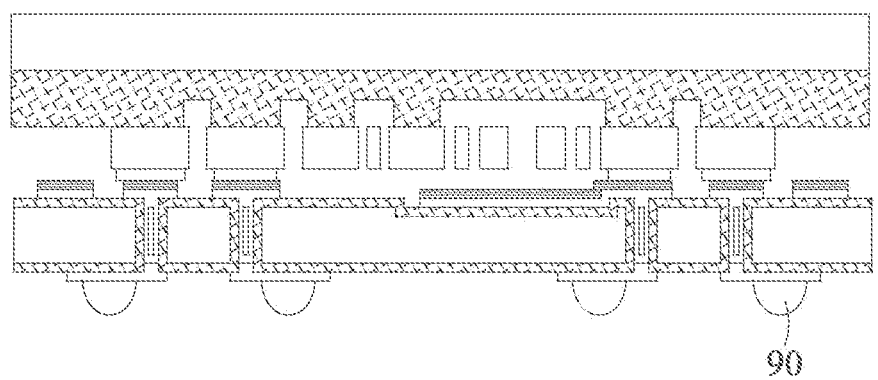
Figure 8F:
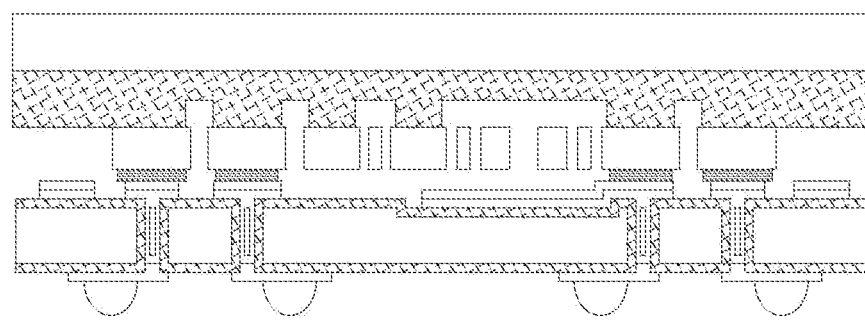

FIG. 8d illustrates formation of an RDL 88, which may be formed by depositing or electroplating an appropriate conductor, and FIG. 8e illustrates formation of connection bumps 90 in electrical and physical contact with RDL 88. Connection bumps 90 may be formed as described in previous embodiments. As with the previous embodiments, eutectic bonding could occur between Ge electrodes on the MEMS device wafer and AlCu electrodes on the cap wafer (as shown in FIG. 8e) or between AlCu electrodes on the MEMS device wafer and Ge electrodes on the cap wafer, as shown in FIG. 8f.

The formation of yet another embodiment is illustrated with regard to FIGS. 9a through 9c and FIGS. 10a through 10h. In this embodiment, MEMS device wafer 61 is formed and processed as described above with respect to FIGS. 6a through 6d. Cap wafer 91 is processed as follows. Cap wafer 91 includes substrate 92 in which a shallow cavity 93 has been formed. The shallow cavity 93 may provide for gap control between the MEMS device wafer 61 and subsequently formed electrodes on cap wafer 91.

Figure 9A:
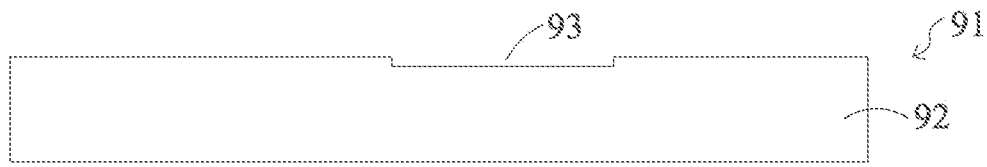
FIGS. 9a through 9c illustrate steps in processing a cap wafer in yet another embodiment.
Figure 9B:
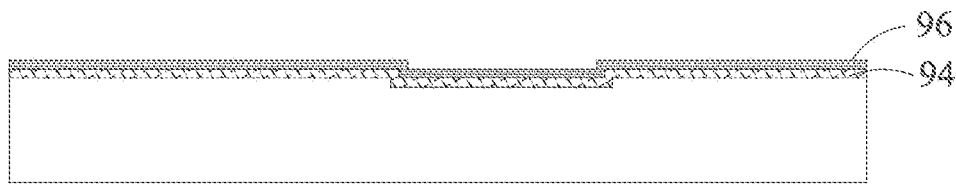
Figure 9C:
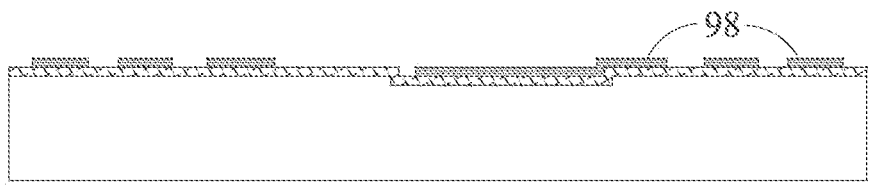

Oxide 94 is deposited atop substrate 92 and within shallow cavities 93 and conductive layer 96 is deposited atop oxide 94, as shown in FIG. 9b. FIG. 9c illustrates the patterning of the conductive layer 96 to form electrodes 98. In an embodiment, the conductive layer 96 may comprise AlCu. The conductive layer 96 acts as eutectic bonding material and can be replaced by conductive materials, which are also suitable for eutectic bonding, such as Ge, Au, or the like.

Figure 10A:
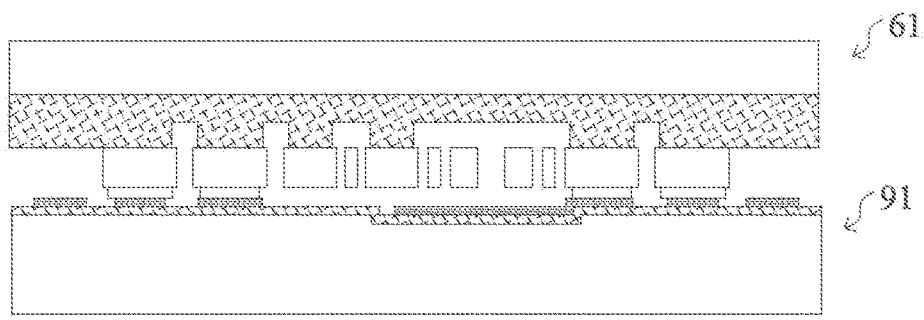
Figure 10B:
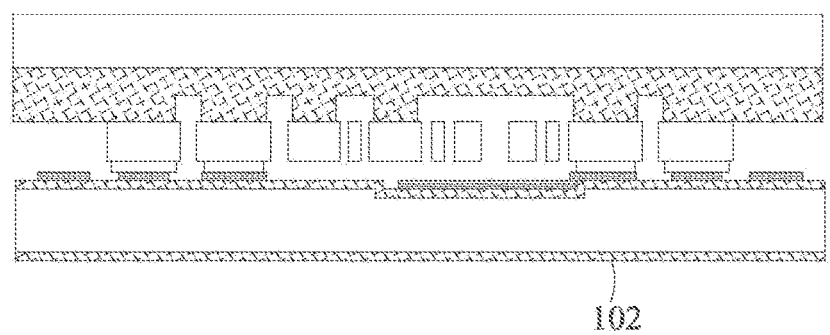

As illustrated in FIG. 10a, MEMS device wafer 61 is bonded to cap wafer 91 using eutectic bonding between electrodes 68 and electrodes 98, in a manner previously described. Substrate 92 may be thinned down to a desired thickness THK, followed by formation of isolation oxide 102 on the backside of thinned down cap wafer 91, as shown in FIG. 10b.

Figure 10C:
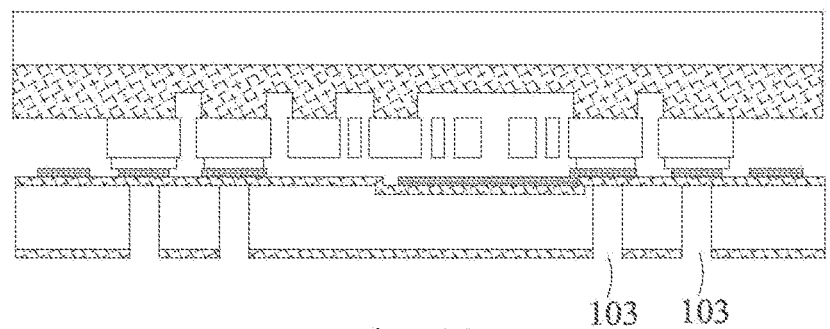
Figure 10D:
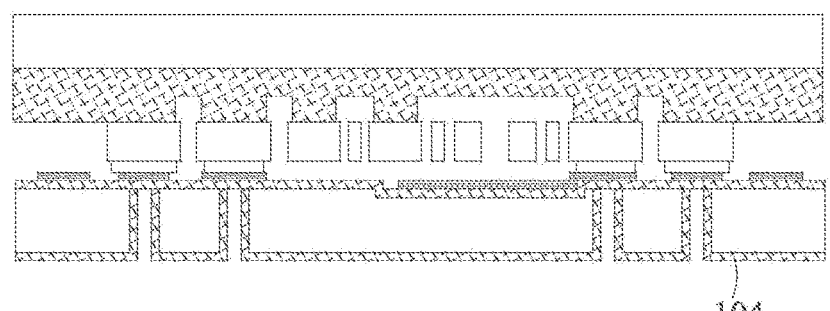
Figure 10E:
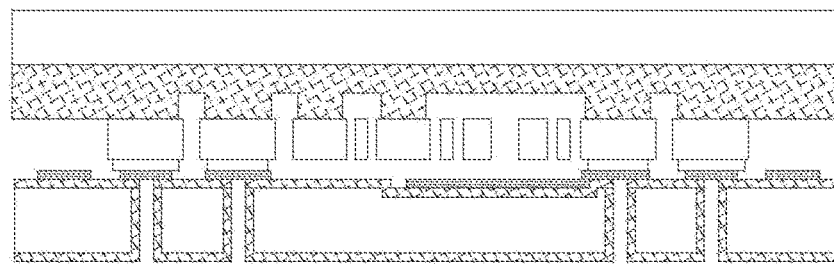

FIG. 10c illustrates the formation of deep vias or trenches 103 and FIG. 10d illustrates the formation of oxide 104 on sidewalls of deep vias or trenches 103. In the formation of the deep vias 103, oxide 94 may be used as an etch stop layer. Exposed portions of oxide 94 are then removed from the deep vias or trenches 103 to expose backsides of electrodes 98, followed by formation of RDL 106 on the backside of cap wafer 91 and sidewalls of deep vias or trenches 103, including in electrical and physical contact with electrodes 98, as illustrated in FIGS. 10e and 10f, respectively.

Figure 10G:
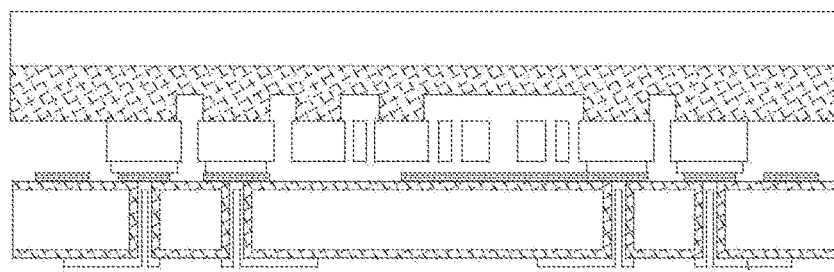
Figure 10G:
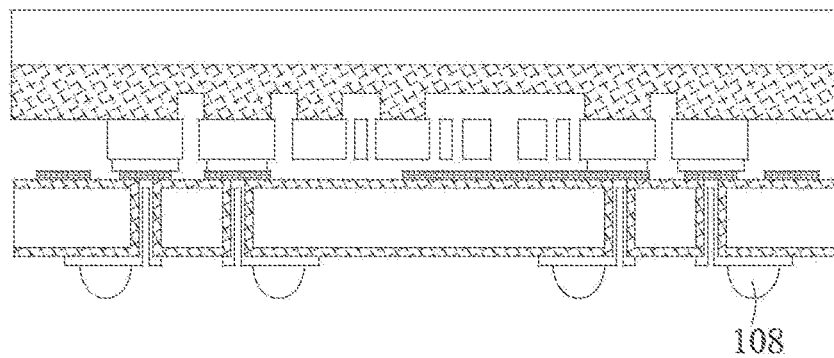
Figure 10H:
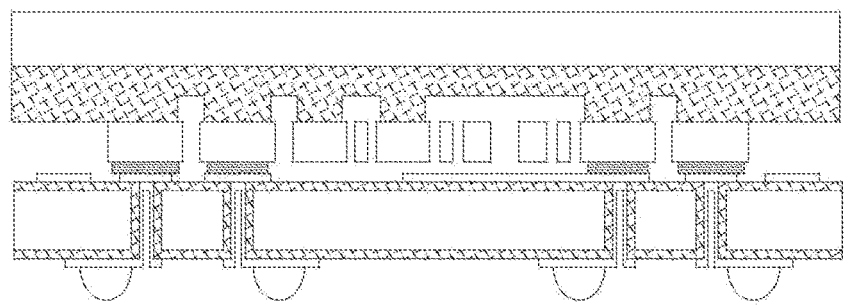

Connection bumps 108 are next formed, as shown in FIG. 10g. The formation of connection bumps 108 has been previously described and is not repeated herein. Whereas eutectic bonding occurs between Ge electrodes 68 on MEMS device wafer 61 and AlCu electrodes 98 on cap wafer 91, alternatively, eutectic bonding could occur between AlCu electrodes formed on MEMS device wafer 61 and Ge electrodes formed on cap wafer 91, as illustrated by FIG. 10h.

An embodiment is a method for forming a microelectromechanical system (MEMS) device. The method comprises forming a MEMS structure over a first substrate, wherein the MEMS structure comprises a movable element; depositing a first conductive material over the first substrate; etching trenches in a second substrate; filling the trenches with a second conductive material; and depositing a third conductive material over the second conductive material and second substrate. The method further comprises bonding the MEMS structure to the second substrate, wherein the bonding is between the first conductive material and the third conductive material, and the bonding forms a vacuum chamber between the first and second substrates; and thinning a backside of the second substrate, wherein the thinning exposes the second conductive material in the trenches.

Another embodiment is a method for forming a MEMS device. The method comprises forming a MEMS structure over a first substrate, wherein the MEMS structure comprises a movable element; depositing a first conductive material on the MEMS structure; depositing a second conductive material over a second substrate; and eutectically bonding the MEMS structure to the second substrate, wherein the bonding is between the first conductive material and the second conductive material, and the bonding forms a vacuum chamber between the first and second substrates. The method further comprises etching trenches in a backside of the second substrate, wherein the etching exposes the second conductive material; and filling the trenches with polysilicon material, wherein the polysilicon material is in electrical and physical contact with the second conductive material.

Yet another embodiment a MEMS device. The MEMS device comprises a MEMS structure, a capping structure, and a vertical interconnection structure. The MEMS structure comprises a densified dielectric layer on a first substrate, a densified etch stop layer on the dielectric layer, and a densified sacrificial layer on the densified etch stop layer, wherein the densified sacrificial layer has recesses extending to the densified etch stop layer. The MEMS structure further comprises a wafer bonded to the sacrificial layer, wherein the wafer comprises a movable element and a static element, and electrodes over the wafer. The capping structure comprises a second substrate bonded to the electrodes. The vertical interconnection structure comprises at least one via through the second substrate, a conductive material within the at least one via, the conductive material electrically coupled to the electrodes.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a microelectromechanical systems (MEMS) device comprising:
    forming a first dielectric layer on a first substrate;
    bonding a first wafer to the first dielectric layer;
    forming a first set of conductive electrodes over the first wafer;
    patterning the first wafer to have a movable element and a static element, the movable element capable of free movement in at least one axis;
    forming a first recess in a second substrate;
    forming a second set of conductive electrodes over the second substrate, at least one of the second set of conductive electrodes extending laterally into the first recess of the second substrate;
    bonding the second substrate to the first substrate using the first and second sets of conductive electrodes, wherein after the bonding, the first recess in the second substrate being interposed between the second substrate and the movable element in a plane orthogonal to a major surface of the first substrate; and
    forming a conductive via extending through the second substrate, the conductive via electrically coupled to at least one of the conductive electrodes of the first and second sets of conductive electrodes, the conductive via comprising polysilicon.

2. The method of claim 1 further comprising:
    forming a redistribution layer on a backside of the second substrate, the redistribution layer being in electrical and physical contact with the conductive via; and
    forming a contact bump on the redistribution layer.

3. The method of claim 1 further comprising:
    densifying the first dielectric layer on the first substrate, the densified first dielectric layer having a second recess therein.

4. The method of claim 3, wherein the movable element is interposed between the second recess in the densified first dielectric layer and the first recess in the second substrate.

5. A method comprising:
    forming a first dielectric layer on a first substrate, the first dielectric layer having first recesses therein, the first dielectric layer being a densified dielectric layer;
    bonding a first wafer to the first dielectric layer;
    forming a first set of conductive electrodes over the first wafer;
    patterning the first wafer to form a movable element and a static element, the movable element capable of free movement in at least one axis;

bonding a second substrate having a second set of conductive electrodes to the first substrate using the first and second set of conductive electrodes; and forming a first via through the second substrate, the first via having a first conductive material within the first via, the first conductive material being electrically coupled at least one of the conductive electrodes of the first and second sets of conductive electrodes.

6. The method of claim 5, wherein the first conductive material is polysilicon.

7. The method of claim 5, wherein bonding the second substrate having the second set of conductive electrodes to the first substrate using the first and second set of conductive electrodes comprises:

eutectically bonding the first set of conductive electrodes to the second set of conductive electrodes.

8. The method of claim 5, wherein bonding the second substrate having the second set of conductive electrodes to the first substrate using the first and second set of conductive electrodes forms a first chamber between the first and second substrates and surrounding the movable element, the first chamber including at least one of the first recesses in the first dielectric layer.

9. The method of claim 8, wherein the first chamber has a pressure level from about 0.1 mbar to about 100 mbar.

10. The method of claim 5 further comprising:

forming a second recess in the second substrate, at least one of the second set of conductive electrodes extending laterally into the second recess of the second substrate, the second recess in the second substrate being interposed between the second substrate and the movable element in a plane orthogonal to a major surface of the first substrate.

11. The method of claim 10, wherein a distance between the at least one of the second set of conductive electrodes in the second recess and the movable element being from about 1 μm to about 5 μm.

12. The method of claim 5 further comprising:

forming a redistribution layer on a backside of the second substrate, the redistribution layer being in electrical and physical contact with the first conductive material in the first via; and forming a contact bump on the redistribution layer.

13. The method of claim 5, wherein at least one set of the first set and the second set of conductive electrodes comprises an aluminum copper alloy and the other one of the first set and the second set of conductive electrodes comprises germanium.

14. A method comprising:

forming a first dielectric layer on a first substrate;

densifying the first dielectric layer;

bonding a first wafer to the densified first dielectric layer, the first wafer comprising a movable element and a static element, the movable element capable of free movement in at least one axis;

forming a first set of conductive electrodes over the first wafer;

forming a first recess in a second substrate;

forming a first trench in the second substrate;

forming a first conductive material in the first trench;

forming a second set of conductive electrodes on the second substrate and over the first conductive material in the first trench, at least one of the second set of conductive electrodes extending laterally into the first recess of the second substrate, the first conductive material being electrically coupled at least one of the conductive electrodes of the first and second sets of conductive electrodes;

bonding the second set of conductive electrodes to the first set of conductive electrodes; and thinning a backside of the second substrate to expose the first conductive material in the first trench.

15. The method of claim 14, wherein the densified first dielectric layer comprises at least one recess.

16. The method of claim 15 wherein the movable element is interposed between the at least one recess in the densified first dielectric layer and the first recess in the second substrate.

17. The method of claim 14, wherein bonding the second set of conductive electrodes to the first set of conductive electrodes forms a first chamber between the first and second substrates and surrounding the movable element, the first chamber including the first recess in the second substrate.

18. The method of claim 17, wherein the first chamber has a vacuum level from about 0.1 mbar to about 100 mbar.

19. The method of claim 14, wherein the first conductive material is polysilicon.

20. The method of claim 14, wherein at least one set of the first set and the second set of conductive electrodes comprises an aluminum copper alloy and the other one of the first set and the second set of conductive electrodes comprises germanium.

\* \* \* \* \*